United States Patent
Smith et al.

[11] Patent Number: 5,180,470
[45] Date of Patent: Jan. 19, 1993

[54] DEPOSITION OF HIGHLY-ORIENTED PTFE FILMS AND USES THEREFOR

[75] Inventors: Paul Smith, Santa Barbara, Calif.; Jean C. Wittmann, Mundolsheim, France

[73] Assignee: The Regents of the University of California, Berkeley, Calif.

[21] Appl. No.: 361,129

[22] Filed: Jun. 5, 1989

[51] Int. Cl.$^5$ ............................................. C30B 29/58
[52] U.S. Cl. ........................... 156/600; 150/DIG. 113
[58] Field of Search ...................... 156/600, DIG. 113

[56] References Cited

U.S. PATENT DOCUMENTS

| | | | |
|---|---|---|---|
| 3,453,566 | 7/1969 | Kasahara | 610/486 |
| 3,776,465 | 12/1973 | Baker | 239/251 |
| 4,344,908 | 8/1982 | Smith et al. | 264/203 |
| 4,411,854 | 10/1983 | Maurer et al. | 264/205 |
| 4,769,433 | 9/1988 | Chanzy et al. | 526/348.1 |

FOREIGN PATENT DOCUMENTS 56-156502 12/1981 Japan .................................... 156/600

OTHER PUBLICATIONS

Lauer et al., "Investigation of PTFE Transfer Film By Infrared Emission . . . ", *NASA Tech. Meno.* NASA-TM 89844, E-3505 1987 abstract only.
Meiboom et al., "Molecular Orientation of Monomolecular Liquid Crystal Layers on Various Substrates", *Phys. Chem. Liq. Cryst. Devices* 1980 abstract only.
Steijn, "Sliding Surface of Poly(Tetrafluoroethylene) Investigated with the Electron Microscope", *Amer. Chem. Soc., Div. Petrol. Chem. Propr.*, 13(2) 1968 abstract only.
Klinedinst, "PTFE Film Adhesion to Electronically Conducting Materials", *Adhes. Aspects Polym. Coat.* 1983 abstract only.

*Primary Examiner*—Robert Kunemund
*Attorney, Agent, or Firm*—Morrison & Foerster

[57] ABSTRACT

Broadly the invention is a method for forming a highly-oriented crystal structure on a substrate in a known orientation comprising the steps of forming a film of highly-oriented poly(tetrafluoroethylene) with an orientation angle of less than 20° on a surface of the substrate with its nominal orientation director along a desired orientation director and then depositing a crystal-forming material on the highly-oriented poly(tetrafluoroethylene) to form the structure. Specific examples include a method for growing a highly-oriented crystal on filament substrates, a method for producing extruded polymer articles (fibers, tapes, and solids) containing oriented crystal growth to improve the characteristics thereof, and a method for storing and retrieving data.

23 Claims, 2 Drawing Sheets

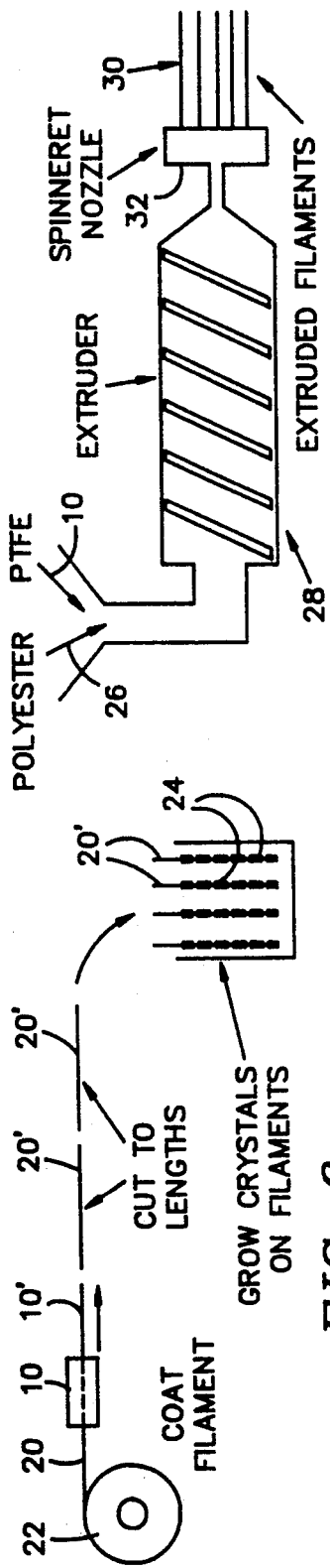
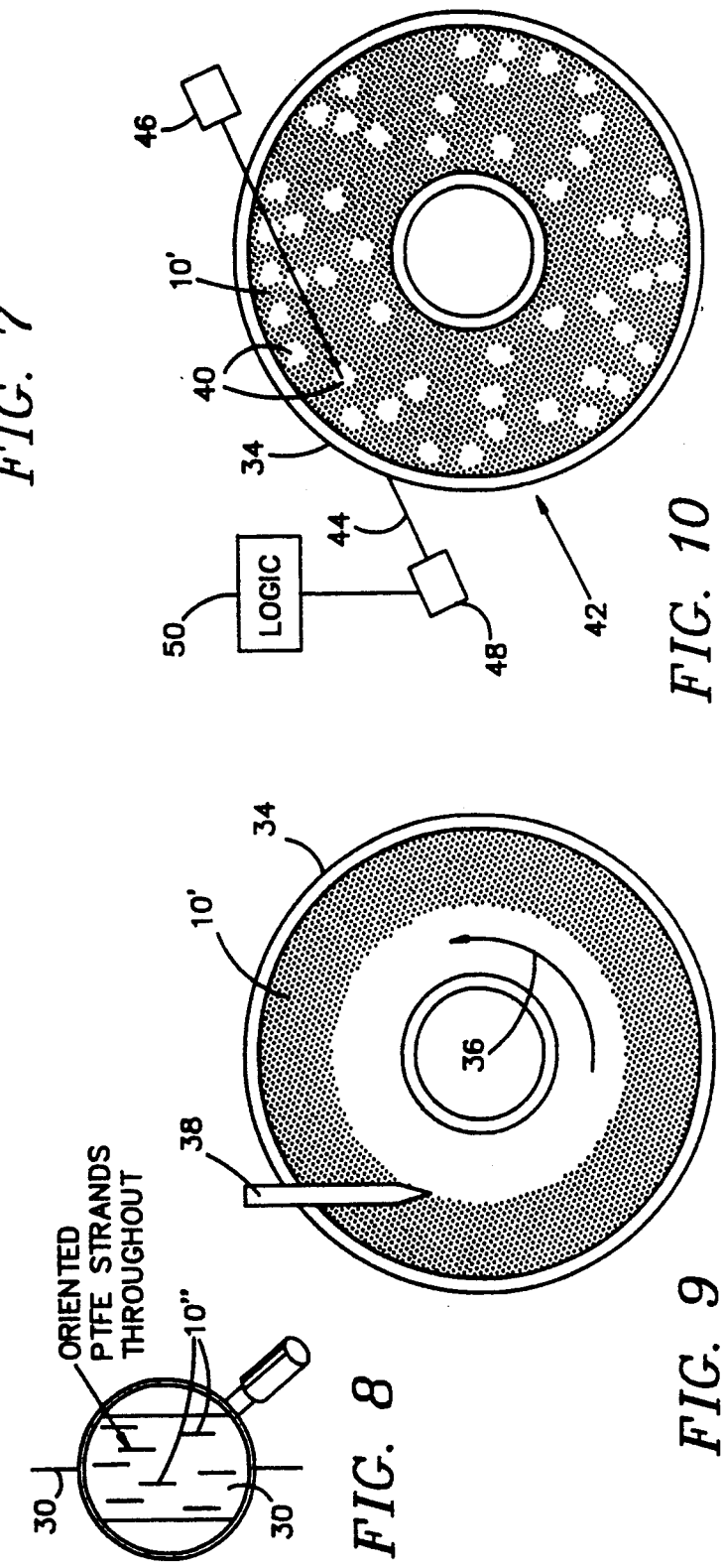

DEPOSITION OF HIGHLY-ORIENTED PTFE FILMS AND USES THEREFOR

BACKGROUND OF THE INVENTION

This invention relates to highly-oriented materials and to processes for nucleation and growth thereof and, in particular, in a process involving the deposition of a crystal structure on a substrate, to the improvement for stimulating crystal growth comprising the step of providing highly-oriented poly(tetrafluoroethylene) having an orientation angle of less than 20° on the surface of the substrate. More particularly, the method includes provision for stimulating highly-oriented crystal growth along a pre-established orientation director by additionally comprising the step of orienting the poly(tetrafluoroethylene) with its nominal orientation director along a desired orientation director.

The formation of highly-oriented structures, such as single crystals, single-domain liquid crystals, or uniaxially-oriented crystallites, is of major technological importance for many applications that range from reinforcing materials to electronic displays. Oriented materials can be manufactured in many ways; however, general techniques to orient a great variety of different materials are not available. Currently, the selection of the appropriate method is governed primarily by the nature of the species that is to be oriented. Moreover, techniques for stimulating crystal growth, particularly of a highly-oriented variety, are often difficult and very expensive to implement in an industrial environment. As a result, the associated products are of higher cost then they would otherwise be.

Small molecules are frequently processed into oriented structures by the tedious growth of single crystals, or by a technique known as epitaxial crystallization, onto single-crystalline substrates. Regarding the latter method, it is generally believed by those skilled in the art that lattice matching of the crystalline substrate and material of interest is required in two dimensions for epitaxial crystallization to occur. As a result, relatively few systems are known in the art; and, in many cases, new epitaxial surfaces need to be found for each newly discovered material. Examples of substrates commonly used for epitaxial growth are quartz, muskovit, alkali halides, and salts of aromatic organic acids. More recently, a technique referred to as graphoepitaxy has been proposed for the oriented growth of some materials. In this method, materials are deposited on substrates (frequently amorphous) onto which a precision relief grating has been etched. Typical grating distances are of the order of 0.3 μm. According to reports, graphoepitaxy has been successfully applied to some metal halides and $SiO_2$.

The use of some moderately-oriented, semi-crystalline polymers as substrates for epitaxial growth of a few small molecular materials has been described in the art. For example, moderately-oriented polyethylene, isotactic polypropylene, polybutyl, and isotactic polystyrene have been used as substrates for epitaxial crystallization of several metals. Although some success was reported for a few species, such as Sn, Te and Bi, the phenomenon certainly was not general. For example, no effects were observed with Zn, Au, Ni, Co, Ga, and Sb. No epitaxial effects were observed with poly(vinylidene fluoride) substrates, and the use of poly(tetrafluoroethylene) was not described or suggested.

Amphiphilic molecules generally are oriented into structures known as Langmuir-Blodget films. This technique becomes tedious and ineffective for thicknesses beyond a few monolayers and is, therefore, currently of limited practical use.

Liquid crystalline materials of small molecules are generally oriented in electric or magnetic fields. Another method for orienting liquid crystalline materials consists of the deposition onto "rubbed polymer surfaces", which appears to resemble a somewhat rudimentary form of the graphoepitaxial method mentioned above. Also, surfaces onto which SiO is obliquely evaporated have been used to align liquid crystals.

Oriented structures of macromolecular materials generally are made by expanding melt- or solution- processed, or paste-extruded and/or sintered objects, such as films, tapes and fibers, through well-known drawing technologies. These techniques are routinely applied for many polymeric materials. Examples of such practices are well-known in the art, and are disclosed in, for example, U.S. Pat. Nos. 2,776,465 and 3,953,566. Mostly, the drawing methods are limited to maximum draw ratios (final length/original length) of 10 or less, which leads to the formation of macroscopic structures of only moderate orientation, and of limited length. Generally, the degree of orientation achieved in tensile drawing is moderate and can sometimes be inhomogeneous. Only recently, methods have been disclosed to achieve draw ratios of 100 or more; but, these techniques are applicable to only few high polymer systems. Examples are disclosed in U.S. Pat. Nos. 4,344,908, 4,411,854 and 4,769,433.

A few reports have been published on the orientation of polymers through epitaxial crystallization onto small molecular crystals; however, as was observed also for small molecular epitaxy, only a few selected systems were found to be effective, and the method is not used commercially. An attempt was reported by Takahashi, et al. to epitaxially crystallize polymers onto tapes of poly(tetrafluoroethylene) that were moderately-oriented by drawing to four times their original length. Such drawn polymer tapes have orientation angles, as measured by wide-angle X-ray scattering, of 30° or more. Only very weak orientation was observed for polyethylene, poly-ε caprolactone and nylon 6 that were crystallized onto these poly(tetrafluoroethylene) tapes. The growth of other materials, notably liquid crystals, small organic molecules, and oligomers and other polymers was not disclosed or suggested.

The prior art orientation methods described above are most certainly not generally applicable to a wide variety of materials; and, in addition, mostly yield relatively poor orientation on a macroscopic scale. The crystal size of the epitaxially crystallized materials of interest, in many instances, is very small, typically in the nanometer-micrometer range.

It is thus an object of this invention to provide oriented poly(tetrafluoroethylene) structures as substrates for the formation of macroscopically-oriented structures of a vast variety of materials.

More specifically, it is an object of the present invention to provide orientation inducing substrates and a method for inducing the formation of macroscopic, highly-oriented structures of a wide variety of materials.

Other objects and benefits of the invention will become apparent from the description which follows hereinafter when taken in conjunction with the drawing figures which accompany it.

SUMMARY

The foregoing and other objects can be achieved by one or more of the following embodiments of the invention.

In one embodiment of the present invention, an oriented poly(tetrafluoroethylene) structure is provided onto which deposited materials are obtained in an oriented structure.

In another embodiment of the present invention, a substrate covered with oriented poly(tetrafluoroethylene) is provided onto which deposited materials are obtained in an oriented structure.

In yet another embodiment, the invention is directed to the melt-or solution-crystallization of materials onto oriented poly(tetrafluoroethylene) substrates.

In another embodiment, the invention is directed to the chemical or vapor deposition of a material onto oriented poly(tetrafluoroethylene) substrates.

In a further embodiment, the invention is directed to a method of fabrication of a shaped article comprising: (a) providing an oriented poly(tetrafluoroethylene) composition; and (b) contacting the oriented poly(tetrafluoroethylene) with a super-saturated solution, melt, or vapor of a crystallizable material or a liquid crystal forming species, whereby said material is obtained in a highly-oriented form.

More particularly, the foregoing objects have been achieved by the method for forming a highly-oriented crystal structure of the present invention comprising the steps of, preparing a substrate having highly-oriented poly(tetrafluoroethylene) with an orientation angle of less than 20° on a surface of the substrate; and, depositing a crystal-forming material on the highly-oriented poly(tetrafluoroethylene). In the preferred embodiment, the method further includes a step for forming the highly-oriented crystal structure with orientation along a pre-established orientation director of orienting the poly(tetrafluoroethylene) with its nominal orientation director along a desired orientation director.

In one embodiment, the substrate is non-oriented poly(tetrafluoroethylene) and said step of preparing a substrate comprises the step of stressing the non-oriented poly(tetrafluoroethylene) at a surface thereof in the desired orientation direction at a temperature and pressure which will orient the non-oriented poly(tetrafluoroethylene) in the desired orientation direction.

In another embodiment, the substrate is not poly(tetrafluoroethylene) and said step of preparing a substrate comprises the step of moving a surface of the substrate along non-oriented poly(tetrafluoroethylene) in the desired orientation direction at a temperature and pressure which will transfer a film of the poly(tetrafluoroethylene) to the surface of the substrate oriented in the desired orientation direction.

In still another embodiment, the substrate is formed of a non-oriented poly(tetrafluoroethylene) and said step of preparing a substrate comprises the step of forming the non-oriented poly(tetrafluoroethylene) into whiskers at a temperature and pressure which will cause the whiskers to be oriented in the desired orientation direction.

In a further embodiment, the process is a polymer extrusion process, the substrate is to comprise highly-oriented fibrils disposed within polymer fiber, tape, or other products produced by the extrusion process, the substrate is formed of a non-oriented poly(tetrafluoroethylene), and said step of preparing a substrate comprises the step of adding poly(tetrafluoroethylene) dispersion particles to solid or fluid-state polymers entering mixing and extruding apparatus performing the extrusion process and producing the polymer extruded articles whereby mechanical friction forces between the dispersion particles and polymers within and with the apparatus form highly-oriented poly(tetrafluoroethylene) fibrils within the polymer articles extruded.

In yet another embodiment, the substrate is not poly(tetrafluoroethylene) and said step of preparing a substrate comprises the step of moving non-oriented poly(tetrafluoroethylene) along a surface of the substrate in the desired orientation direction at a temperature and pressure which will transfer a film of the poly(tetrafluoroethylene) to the surface of the substrate oriented in the desired orientation direction. In a variation of this embodiment, the substrate is used in an information storage and retrieval system and additionally comprising the step of selectively heating areas of the highly-oriented poly(tetrafluoroethylene) on the surface of the substrate in a pattern representing data information to a point where highly-oriented poly(tetrafluoroethylene) in the areas is disoriented whereby said subsequent step of depositing a crystal-forming material creates a recognizable difference between areas containing highly-oriented poly(tetrafluoroethylene) and areas containing non-oriented poly(tetrafluoroethylene). Preferably in this application the substrate is clear glass and said step of depositing a crystal-forming material comprises the steps of, placing a liquid crystalline material onto the glass substrate maintained at a temperature above the nematic-isotropic transition temperature of the liquid crystal crystalline material; and, cooling the glass substrate to room temperature whereby the liquid crystalline material forms a transparent substantially single domain in areas containing highly-oriented poly(tetrafluoroethylene) and opaque areas in areas containing non-oriented poly(tetrafluoroethylene).

DESCRIPTION OF THE DRAWINGS

FIG. 6 is a simplified drawing depicting a manufacturing process for stimulating the growth of highly-oriented crystals by first coating filaments upon which the crystals are grown with highly-oriented poly(tetrafluoroethylene).

FIG. 7 is a simplified drawing depicting a manufacturing process for stimulating the growth of highly-oriented crystals within polyester filaments by mixing and extruding the polyester material in combination with micro particles of poly(tetrafluoroethylene) to include microstrands of highly-oriented poly(tetrafluoroethylene) within the extruded polyester filaments which, in turn, stimulate the growth of highly-oriented crystals within polyester filaments.

FIG. 8 is a simplified drawing depicting a highly magnified portion of one of the polyester filaments produced by the manufacturing process of FIG. 7 and showing the microstrands of highly-oriented poly(tetrafluoroethylene) within the extruded polyester filament.

FIG. 9 is a simplified top view of one step of an example process of producing a memory device employing the techniques of the present invention.

FIG. 10 is a simplified top view of another step of the example process of producing a memory device employing the techniques of the present invention.

DESCRIPTION OF THE PREFERRED EMBODIMENT

The present invention is based on the surprising discovery by the inventors herein that (i) oriented poly(tetrafluoroethylene) structures facilitate crystal nucleation of a great variety of materials and (ii) the oriented poly(tetrafluoroethylene) induces the formation of oriented single crystals as well as highly-oriented crystallites or liquid crystals. This discovery was completely unexpected and very surprising indeed because it has been generally assumed by those skilled in the art that poly(tetrafluoroethylene) surfaces are ineffective nucleating agents. Thus, in the general practive of the present invention as will be described in detail hereinafter, the formation of highly-oriented shaped articles such as films, tapes and coatings is achieved by crystallizing or depositing the material that is to be nucleated or oriented, in any form or precursor composition, onto oriented poly(tetrafluoroethylene).

As will be appreciated by those skilled in the art from the descriptions which follow, the invention is directed to the use of oriented poly(tetrafluoroethylene) manufactured in any form. Thus, with respect to oriented poly(tetrafluoroethylene) structures, the present invention includes (i) ultra-drawn, extended chain poly(tetrafluoroethylene) in the form of filaments, tapes, films and the like, (ii) poly(tetrafluoroethylene) single crystals or whiskers, (iii) extended chain poly(tetrafluoroethylene) fibers or fibrils, or (iv) substrates, such as quartz, glass, oriented or unoriented polymers, single crystals, flat surfaces, fibers, tubes, capillaries and the like, that are coated with oriented poly(tetrafluoroethylene). The present invention will also be seen to include poly(tetrafluoroethylene) polymers that contain a co-monomer or monomers, such as hexafluoropropylene. In such case, the co-monomer content is less than 5%, and preferably less 2%.

Figure 2:
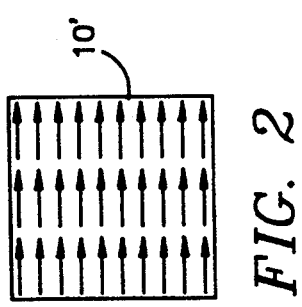
FIG. 2 is a simplified drawing depicting poly(tetrafluoroethylene) in an oriented state.
Figure 1:
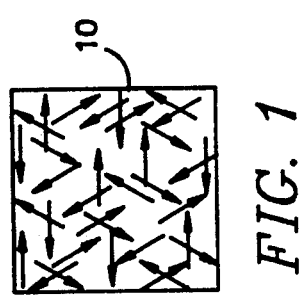
FIG. 1 is a simplified drawing depicting poly(tetrafluoroethylene) in a non-oriented state.
Figure 4:
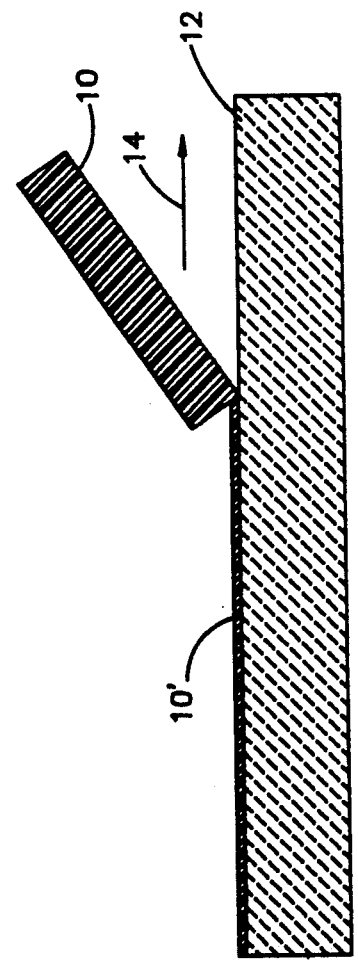
FIG. 4 is a cutaway side view of a substrate having oriented poly(tetrafluoroethylene) formed on the surface thereof according to the method of FIG. 3.
Figure 5:
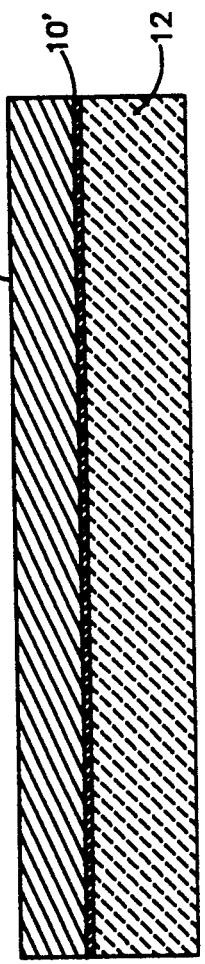
FIG. 5 is a cutaway side view of the substrate of FIG. 4 depicting an oriented material formed on the oriented poly(tetrafluoroethylene) on the surface thereof.

Particularly suitable for the practice of the present invention are substrates coated with thin, transparent films of oriented poly(tetrafluoroethylene). The basic idea is to take unoriented poly(tetrafluoroethylene) such as that depicted in simplified form in FIG. 1, where it is indicated as 10, and form an oriented film of poly(tetrafluoroethylene) as depicted in simplified form in FIG. 2, where it is indicated as 10', on the substrate. Such oriented films can be prepared, for one example, according to a technique wherein poly(tetrafluoroethylene) is prepared by standard techniques and then formulated into an oriented structure through mechanical application onto suitable substrates. Mechanical application of the oriented structures can be executed in many different ways. Further to the example, poly(tetrafluoroethylene) can be compression molded into a solid structure, such as a pellet, bar, ingot, rod, stick and the like, of a convenient form. The compressed polymer (10 in FIG. 4) is then pressed against and along a suitable substrate 12 in a homogeneous, smooth motion, while applying a moderate force (as indicated by the arrow 14), leaving a thin (typically 5-50 nm thickness) highly-oriented film of poly(tetrafluoroethylene) 10', as depicted in FIG. 4. The oriented material 16 can then be deposited on the film 10' with ease using techniques well known to those skilled in the art. The magnitude of the force required to produce the highly-oriented film of poly(tetrafluoroethylene) 10' can be adjusted readily to yield the desired results by those skilled in the art without undue experimentation.

Figure 3:
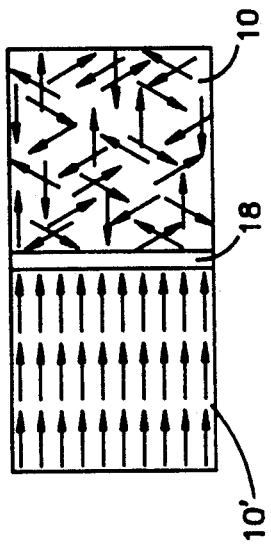
FIG. 3 is a simplified drawing depicting one method of transforming the non-oriented poly(tetrafluoroethylene) of FIG. 1 into the oriented poly(tetrafluoroethylene) of FIG. 2.

In an alternate technique as depicted in FIG. 3, "as-polymerized" poly(tetrafluoroethylene) 10 in its powdrous form is placed in between a spreading knife 18 and a suitable substrate 12 and the oriented polymer structure 10' is produced by smooth spreading. In another method, "as-polymerized" poly(tetrafluoroethylene) is used in its commercially available dispersion form. The latter, typically, is an aqueous dispersion of fine poly(tetrafluoroethylene) particles, commonly of about 0.2 $\mu$m diameter. The surface of a suitable substrate is coated with the poly(tetrafluoroethylene) particles through evaporation of the dispersion medium (e.g., water). Subsequently, the oriented poly(tetrafluoroethylene) structure is produced, for example, by moving a spreading knife or other object in a smooth continuous motion against the coated substrate in the manner of FIG. 3. In yet another method, a suitable substrate, for example in fiber, tape or film form, is passed in a smooth, continuous motion against, or through "as-polymerized" poly(tetrafluoroethylene) or compressed poly(tetrafluoroethylene), leaving a coating of highly-oriented poly(tetrafluoroethylene).

In still another method, poly(tetrafluoroethylene) dispersion particles are added to liquids or molten polymers, and through mechanical friction forces between the liquids and the container, such as vessels, tubing or pipes, capillaries, spinnerets and the like, a coating of oriented poly(tetrafluoroethylene) can be formed onto the internal surfaces.

In yet another method, poly(tetrafluoroethylene) dispersion particles are mixed with polymer solutions or molten polymers in any extrusion equipment, which causes the formation of highly-oriented poly(tetrafluoroethylene) fibrils, suitable for the present invention.

Also suitable for practice of the present invention are highly-oriented poly(tetrafluoroethylene) whiskers formed during the polymerization of tetrafluoroethylene in the presence of relatively high concentrations of perfluorinated surfactants.

The choice of the form of the oriented poly(tetrafluoroethylene) and its application (without or onto a substrate) is dictated largely by its final use. For example, in applications in manufacturing oriented crystals of organic compounds for optical devices, transparent glasses coated with oriented poly(tetrafluoroethylene) may be preferred substrates. It is within the skill of the art, based on the present disclosure, to screen and select from the various oriented poly(tetrafluoroethylene) structures.

Although, generally, no special surface preparations are necessary, application onto the ultra-oriented polymer substrates may be facilitated by common surface treatments, such as cleaning, irradiation, light etching, etc.

While on the one hand, the structures of the oriented poly(tetrafluoroethylene) and its application according to the basic teachings of the present are many, varied, and variable according to the needs of the process or article of interest, in like fashion, many crystallizable materials are suitable for the application of the present invention to achieve enhanced nucleation and oriented growth. Examples of suitable materials are oligomers of polymers, polymers, organic small molecules, metals, pure or alloys, ceramics, ceramic precursors, monomers, to yield oriented polymers, organo-metallic species, liquid crystals, biological species, etc.

It should be noted at this point that the detailed description of the tests conducted and the specific applications of the present invention which follows hereinafter (as well as the appended claims) concentrates on and employs terms such as crystal and crystal growth. This is because it is impossible to employ more general terms and maintain the readability and understandability of the materials. Thus, it is the inventors' intent that the term crystal and related terms employed in the specification and appended claims include any type of material which can be deposited in the manner of a crystalline material and which exhibits the orientation characteristics of a crystalline structure. It is also the inventors' intent that despite specific claim language employing the term crystal, or the like, the appended claims be accorded a breadth in keeping with the scope and spirit of the broad invention which is being disclosed herein.

In the present invention, all methods of contacting the materials in all forms with the oriented poly(tetrafluoroethylene) can be applied. Specifically, suitable materials can be deposited by crystallization from the melt or from solutions. Alternatively, the crystallizable materials can be deposited from their vapors, or through any form of chemical vapor deposition, or decomposition. In yet another method, the suitable materials can be formed onto the oriented poly(tetrafluoroethylene) through epitaxial synthesis, or metathesis. In still another application of the present invention, polymerizable monomers are deposited onto the oriented poly(tetrafluoroethylene), which are subsequently polymerized.

The temperature at which contacting in any form of the crystallizable material with the ultra-oriented polymer structure is executed is not critical, provided that the temperature is below the melting or decomposition temperature of the oriented poly(tetrafluoroethylene) structure, i.e., below approximately 350° C. Also, temperatures below room temperature, and more specifically below 17° C. are less suitable.

It is worthy of special note at this point that the inventors herein have found in tested implementations that the highly-oriented structures produced according to the present invention differ markedly from prior art like compositions in structure and properties in that the materials crystallized onto the oriented poly(tetrafluoroethylene) according to the method of the present invention are exceptionally uniformly oriented over the entire surface that is covered with oriented poly(tetrafluoroethylene), in many cases being of single crystal-type orientation or a monodomain.

Another major point of note, the orientation of the oriented poly(tetrafluoroethylene) structures need not be uniaxial. If so desired, specified patterns, such as waved, concentric, cross-hatched, etc., can be applied, or the orientation director of the poly(tetrafluoroethylene) can be applied following specified flow lines. Of particular relevance to the discussion, examples, and appended claims is the definition of high orientation in such non-linear, non-uniaxial patterns. According to the practice of the present invention, oriented structures of poly(tetrafluoroethylene) are used with an orientation angle of less than 20°. The orientation angle is conveniently measured by standard X-ray or electron diffraction techniques well known to those skilled in the art. In the tested embodiments reported herein, orientation angles were measured on the second equatorial X-ray (or electron diffraction) reflection, and were formed by drawing a line from each end of the arc or spot to the center of the diffractogram. Non-uniaxial patterns of oriented poly(tetrafluoroethylene) coatings can be characterized by a typical characteristic length, such as the wave length of a waved pattern, or the radius of a circular pattern. It is understood that in these patterns, the orientation angle of the poly(tetrafluoroethylene) coating is measured over a distance much smaller than the characteristic length of the pattern.

The oriented poly(tetrafluoroethylene) structure can be patterned by local heating, or mechanical distortion, which causes local disorientation, that, in turn, locally destroys the orientation inducing property of the poly(tetrafluoroethylene) structures. Therefore, substrates covered with oriented poly(tetrafluoroethylene) could be useful in information storage applications, and the like, in a manner to be described in greater detail shortly.

It should also be noted in passing that if so desired, highly-oriented materials produced according to the present invention may be removed from the oriented poly(tetrafluoroethylene) substrates onto which they were manufactured or used with the substrate, as appropriate for the particular application. Note also that highly-oriented structures produced by the present invention may have many applications that can be dictated by the intrinsic physio/chemical properties of the materials grown onto the substrates. For example, the present invention provides for the induction of nucleation and oriented crystal growth of a wide variety of substances of great use for many opto/electronic materials and devices. Before further description of specific applications of the present invention, several examples of tests conducted by the inventors herein will be reported in detail. The following examples are provided for illustrative purposes only, and are not intended to limit the scope of the present invention, which is defined in the appended claims. Likewise, the use of specific examples and language is not intended to be limiting to the breadth accorded the appended claims. It is the inventors' intent that the claims be accorded a breadth in keeping with the scope and spirit of the invention disclosed herein in its many embodiments and uses, both disclosed and undisclosed.

EXAMPLE 1

This is a comparative example, outside the present invention. The organic substance 2-methyl 4-nitroanaline was disposed molten on a glass slide at a temperature of 160° C. Subsequently, the liquid was quenched to room temperature. Optical polarizing microscopy, with crossed polarizers, revealed that the 2-methyl 4-nitroanaline crystallized into small, randomly-oriented crystallites.

EXAMPLE 2

As-polymerized poly(tetrafluoroethylene) powder (DuPont Co., Teflon 6) was compressed into a pellet of 10 mm diameter. The polymer pellet was moved in a smooth, continuous motion across a glass slide at room temperature, while applying a force of approximately 500 g. A thin, fully transparent layer of highly-oriented poly(tetrafluoroethylene) was formed onto the glass slide. Transmission electron microscopy showed that the thin polymer layer was of a thickness of approximately 20 nm, highly-oriented, and of an orientation angle of less than 10°.

Example 1 was repeated using the poly(tetrafluoroethylene) covered slide. The 2-methyl 4-nitroanaline melt was placed onto the polymer coated slide, which was maintained at 160° C. Subsequently, the material was quenched by contacting the bottom side of the poly(tetrafluoroethylene) coated glass slide with a flat object of room temperature. A homogeneously-oriented, single-crystal like film of 2-methyl 4-nitroanaline was formed. The thickness of the organic film was in the micron range.

EXAMPLE 3

Example 2 was repeated. A commercial bar of poly(tetrafluoroethylene) of 10 mm diameter was used to produce the orientation inducing film onto the glass slide. The polymer bar was moved in a continuous, smooth motion against the glass surface at a temperature of 200° C. A relatively thick (about 0.1 μm) layer of highly-oriented poly(tetrafluoroethylene) was deposited on the glass slide. The orientation angle was determined by electron diffraction to be less than 10°. Contacting 2-methyl 4-nitroanaline melt was the poly(tetrafluoroethylene) coated glass slide and subsequent quenching to room temperature yielded a film of highly-oriented, single-crystal like 2-methyl 4-nitroanaline.

EXAMPLE 4

Example 2 was repeated with a variety of substrates instead of glass, for the formation of highly-oriented poly(tetrafluoroethylene). Invariably, highly-oriented polymer films were obtained onto quartz, aluminium, steel, poly(ethyleneterephthalate) (Mylar, DuPont Co.), and also on a glass slide that was solution-coated with a thin layer of polyacrylic acid. Contacting 2-methyl 4-nitroanaline melt with the poly(tetrafluoroethylene) coated substrates and subsequent quenching to room temperature yielded a film of highly-oriented, single-crystal like 2-methyl 4-nitroanaline.

EXAMPLE 5

A drop of a commercial aqueous poly(tetrafluoroethylene) dispersion (Teflon 6, DuPont Co.) was placed onto a glass slide, and the water was allowed to evaporate at room temperature, leaving a thin film of small polymer particles of approximately 0.2 μm diameter. Subsequently, the poly(tetrafluoroethylene) particles were transformed into a highly-oriented polymer film by moving a metal blade in a smooth continuous motion against the coated surface at room temperature. Experiment 2 was repeated yielding a film of highly-oriented, single-crystal like 2-methyl 4-nitroanaline.

EXAMPLES 6-18

Example 2 was repeated. The materials listed in Table 1 were successfully grown into highly-oriented films by contacting with the orientation inducing poly(tetrafluoroethylene) coated substrates. The contacting conditions (melt, vapor, temperature of species) are listed also.

TABLE 1

| Species | Contacting Condition |
| --- | --- |
| Organic Materials | |
| adipic acid | vapor, 160° C. |
| anthraquinone | melt, 200° C. |
| 5-chlorophenol | vapor, 200° C. |
| chloranil tetrachloro-p-benzoquinone | vapor, 200° C. |
| Inorganic Material | sputtering |
| thallium chloride | |
| Polymers | |
| poly(tetrafluoroethylene) oligomers [$C_{12}F_{26}$, $C_{16}F_{34}$] | melt, 160° C. |
| polyethylene (molecular weight 2,000) | melt, 160° C. |
| alkanes [$C_{36}H_{74}$] | melt, 100° C. |
| poly-ε caprolactone | melt, 100° C. |
| Liquid Crystals | |
| 4-cyano-4'-octanebiphenyl | melt, 80° C. |
| 4-cyano-4'-dodecanebiphenyl | melt, 80° C. |
| 4-n-propyl-cyclohexyl-4'-ethoxybenzene | melt, 80° C. |

EXAMPLE 19

A solution of 5% w/w/ of polyaniline (manufactured by oxidation of aniline) in concentrated sulfuric acid (97%) was prepared at room temperature. A drop of this solution was placed onto a poly(tetrafluoroethylene) covered glass slide (prepared according to the method in Example 2). Immediately, a cover glass was placed onto the polymer solution and moisture was allowed to penetrate. The polyaniline precipitated quickly in the form of an extremely highly-oriented film that showed full extinction in polarized light under cross polarizers.

EXAMPLE 20

Example 19 was repeated with a 2% w/w solution of poly(paraphenylene terephthalamide) (Kevlar, DuPont Co.) in concentrated (97%) sulfuric acid. A film of highly-oriented poly(para-phenylene terephthalamide) was formed upon exposure to moist air.

EXAMPLES 21 and 22

A drop of a dilute (1% solids) aqueous dispersion of highly-oriented poly(tetrafluoroethylene) whiskers (orientation angle less than 1°), formed during the polymerization of tetrafluoroethylene in the presence of relatively high concentrations of perfluorinated surfactants was placed onto a glass slide. The water was allowed to evaporate. A shaving of a pellet of poly(ethylene terephthalate) (PET, DuPont Co.) was placed onto the glass slide that was covered with the poly(tetrafluoroethylene) whiskers. The PET was molten at 265° C. and subsequently quenched to room temperature. Optical microscopy showed that the PET had nucleated onto the poly(tetrafluoroethylene) whiskers and formed oriented crystalline structures with the molecular axis parallel to that of the poly(tetrafluoroethylene) whiskers.

In a comparative Experiment 22, the PET was molten onto a glass slide that was not coated. Quenching the polymer melt to room temperature resulted in the formation of a substantially amorphous film.

EXAMPLES 23-28

Example 21 was repeated. The materials used are listed in Table 2. In each case the polymer nucleated onto the poly(tetrafluoroethylene) whiskers and formed highly-oriented, high birefringent row-nucleated structures with the molecular axis parallel to the whiskers.

TABLE 2

| Species | Contacting Condition |
| --- | --- |
| poly(butylene terephathalate) | melt, 260° C. |
| polybutene-1 | melt, 160° C. |
| nylon 6 | melt, 280° C. |
| nylon 11 | melt, 200° C. |
| polyethylene | melt, 200° C. |
| polyvinylidenefluoride | melt, 210° C. |

EXAMPLE 29

One end of a commercial rod of poly(tetrafluoroethylene) (Teflon, DuPont Co.) was shaped into a point. This Teflon rod was moved in a circular pattern of 5 mm diameter against a glass slide at a temperature of 200° C., while applying a small pressure. A continuous, transparent film of highly-oriented poly(tetrafluoroethylene) was left behind on the glass slide, precisely following the circular pattern. The liquid crystalline material 4-cyano-4'-dodecanebiphenyl was placed onto the polymer-coated glass slide maintained at 80° C., which is above the nematic-isotropic transition temperature of the liquid crystal. After cooling to room temperature, the liquid crystalline material formed a substantially single domain with the director of orientation following the circular pattern of the poly(tetrafluoroethylene). The mono domain was fully transparent, whereas the regions outside the circular pattern were opaque and did not transmit light.

EXAMPLE 30

Example 29 was repeated. A curved pattern in the form of the letters "nsf" was written onto a glass slide with the point-shaped Teflon rod. The liquid crystalline 4-cyano-4'-dodecanebiphenyl was contacted with this coated substrate. After cooling to room temperature, the text developed as a string of transparent, liquid crystalline mono-domains surrounded by highly-opaque material.

EXAMPLE 31

Example 2 was repeated. A thin, transparent film of uniaxially-oriented poly(tetrafluoroethylene) was deposited onto a glass slide. Subsequently, a series of approximately equidistant lines were mechanically cut with a sharp steel blade into the polymer coating. A melt of 2-methyl 4-nitroanaline was placed onto the treated film and subsequently cooled down to room temperature. The 2-methyl 4-nitroanaline formed highly-oriented, single-crystal like domains onto the unmodified poly(tetrafluoroethylene) layer, and unoriented micro-crystallites onto the mechanically damaged areas.

Having thus reported the results of a number of tests of the present invention under laboratory condition and in various embodiments, the ways in which those laboratory tests can be applied to commercial uses within the scope and spirit of the present invention will now be described in detail.

As is known in the art, it is common and known in the manufacturing oriented crystals of organic compounds to grow the crystals on a fiber substrate. The growth of crystals according to known technques is not a simple matter. The growth of oriented crystals employing prior art techniques is even more difficult. Employing the present invention in the manner of FIG. 6 makes both tasks relatively simple. For example, in manufacturing oriented crystals of organic compounds for optical devices, transparent glass fiber 20 from a supply roll 22 is coated with oriented poly(tetrafluoroethylene) 10' by pulling it between blocks of poly(tetrafluoroethylene) 10 under compressive pressure (or a similar arrangement) whereby the poly(tetrafluoroethylene) 10 is wiped onto the glass fiber 20 in the manner described with respect to FIG. 4. The coated fiber 20 is cut into lengths 20' upon which the crystal material 24 is deposited in the usual manner. The highly-oriented poly(tetrafluoroethylene) 10' on the surface of the fiber lengths 20' (having its director longitudinally disposed parallel to each fiber length 20') both stimulates the crystal growth and causes that growth to be highly-oriented as well.

The stimulation of oriented crystal growth when employing the present invention is not limited to the surfaces of structures. An important variation is depicted in FIGS. 7 and 8. In many fiber manufacturing processes, liquid or molten polymers, and the like, are forced through a spinneret, or the like, to form the fibers. The formation of polyester fibers for cloth manufacture, and such, is an example of such a process. As is well known, the formation of oriented crystals in association with the polymer fibers adds greatly to their life and performance characteristics. As is also well known, the stimulation of such crystal growth is a difficult process. The present invention makes the stimulation of oriented crystal growth a simple and automatic part of the fiber manufacturing process. To accomplish this end, poly(tetrafluoroethylene) dispersion particles 10 are added to the liquid or molten polymers 26 entering the mixing and extruding apparatus 28. Through mechanical friction forces between the liquids (i.e. 10, 26) within and with the apparatus 28, highly-oriented poly(tetrafluoroethylene) fibrils 10" are formed within the fibers 30 extruded from the spinneret 32, as depicted in magnified form in FIG. 8. The fibrils 10", of course, stimulate the desired oriented crystal growth throughout the fibers 30 (i.e. not just on their surface). There are, of course, several possible variations on the above-described process which are all within the scope and spirit of this invention. For one, the extruded product could be a tape or even a solid article in which the presence of the fibrils 10" would stimulated oriented crystal growth and thereby improve the characteristics of the product. The poly(tetrafluoroethylene) dispersion particles 10 could also be added to pelletized (i.e. solid) polymers, or other similar materials entering appropriate mixing and extruding apparatus. In fact, early testing by the inventors herein indicates that the formation of the desired fibril 10" may be more pronounced when using solid polymer particles in the original mixture since the frictional and pulling forces developed in the mixing and extruding process are even more intense and long lasting than the case where the polymer is initially in a fluid state and the majority of the fibril formation must take place during the extruding process.

Another interesting (and potentially very important) variation on the above-described theme is in the area of products produced by a lay-up procedure such as used for manufacturing boats, etc. In such processes, the product is produced in a mold by laying up layers of fibers in the form of individual fibers (typically blown into place), tapes, or woven mats in combination with polymer binding agents. If the fibers comprising the lay-up materials include the fibrils 10" as described above, the resultant composite product will have oriented crystaline growth stimulated in the polymer by the presence of the fibrils 10" in the manner described above. As a result, the final product will have improved strength characteristics, and the like.

As mentioned earlier herein, the oriented poly(tetrafluoroethylene) structure can be patterned by local heating. This characteristic in combination with the general method of the present invention provides an opportunity for its use in various forms of information storage, or the like. For example, it is known to coat a substrate (linear or circular) with a magnetizable material. Information is then encoded into the magnetizable material for later retrieval by sensing the magnetic patterns of the material. Computer disk storage devices work this way as well as audio tapes and cassettes. So-called compact disks (CDs) work in a similar manner. In the case of CDs, the information is embedded within the clear plastic of the disk as distortion patterns. It is retrieved by sensing its effect on a laser beam passing through the distortion patterns. This, of course, is simply an optical variation of the traditional "phonograph record" where distortion patterns within the "grooves" are mechanically sensed to retrieve the information contained therein.

A potential application of the present invention to such uses is depicted in FIGS. 9 and 10. A clear disk-shaped substrate 34 (of glass, polycarbonate plastic, or the like) is rotated as indicated by the arrow 36. In the manner of Example 29 above, one end of a Teflon (i.e. poly(tetrafluoroethylene)) rod 38 is brought to bear against the substrate at a temperature of approximately 150° C. while applying a small pressure. As the disk-shaped substrate 34 rotates, the rod 38 is moved slowly from the outer periphery of the substrate 34 towards the center thereof as depicted in FIG. 9. As the result, a continuous, transparent film of highly-oriented poly(tetrafluoroethylene) 10' is left behind on the surface of the substrate 34. The film 10', of course, is oriented in a helical pattern in much the same manner as the "grooves" of a phonograph record or CD. As depicted in FIG. 10, the "data" can then be impressed into the film 10' by local heating (e.g. by thermal head or laser beam) to form the data as non-oriented spots 40. By then placing the liquid crystalline material 4-cyano-4'-dodecanebiphenyl, for example, onto the polymer-coated substrate 34 maintained at 80° C. (i.e. above the nematic-isotropic transition temperature of the liquid crystal), after cooling to room temperature, the liquid crystalline material will form a substantially single domain with the director of orientation following the helical pattern of the poly(tetrafluoroethylene) outside of the spots 40. The mono domain will be fully transparent whereas the non-oriented regions within the spots 40 will be opaque and not transmit light. Optical detection of the data pattern in the manner of a CD, of course, can then be employed. For example, the storage disk 42 can be read and the data stored in the pattern of the spots 40 derived therefrom by shining a light beam 44 through the substrate 34 from a light source 46 to a light sensor 48. The output from the light sensor 48 is connected to logic 50, which defines the pattern of the dots 40 as a function of the areas of the substrate 34 which pass the light beam 44 and those that block it. The data is then derived from the pattern of the dots 40 by the logic 50. As those skilled in the art will have readily recognized, the spots 40 of FIG. 10 are not to scale in order that the phenomenon which is employed can be seen.

Thus, it can be seen from the foregoing description, examples, and specific applications that the present invention is a very basic invention with applicability to a wide field of use and an equally wide variety of applications.

Wherefore, having thus described the present invention, what is claimed is:

1. A process for controlling the growth of crystal-forming or liquid crystalline material to provide ordered crystalline films comprising the steps of:
    forming a highly-oriented poly(tetrafluoroethylene) substrate in which the poly(tetrafluoroethylene) macromolecules are oriented substantially parallel to one another;
    contacting said oriented poly(tetrafluoroethylene) substrate with a crystal-forming or liquid crystalline material;
    solidifying said crystal-forming or liquid crystalline material to yield an oriented crystalline solid on said poly(tetrafluoroethylene) substrate in which one of the crystallographic axes of said crystalline solid is oriented substantially parallel to the poly(tetrafluoroethylene) macromolecules.

2. The process of claim 1 wherein:
    said macromolecules in said poly(tetrafluoroethylene) substrate are oriented such that the orientation angle as measured by wide-angle X-ray diffraction is less than 20°.

3. The improvement to a process involving the deposition of a crystal structure on a substrate of claim 2 wherein the substrate is non-oriented poly(tetrafluoroethylene) and said step of providing highly-oriented poly(tetrafluoroethylene) having an orientation angle of less than 20° on the surface of the substrate comprises the step of:
    stressing the non-oriented poly(tetrafluoroethylene) at a surface thereof in the desired orientation direction at a temperature and pressure which will orient the non-oriented poly(tetrafluoroethylene) in the desired orientation direction.

4. The process of claim 1 wherein said poly(tetrafluoroethylene) macromolecules are oriented to provide an orientation angle as measured by wide angle X-ray diffraction of less than 20°.

5. The improvement to a process involving the deposition of a crystal structure on a substrate of claim 2 wherein the substrate is formed of a non-oriented poly(tetrafluoroethylene) and said step of providing highly-oriented poly(tetrafluoroethylene) having an orientation angle of less than 20° on the surface of the substrate comprises the step of:
    forming the non-oriented poly(tetrafluoroethylene) as whiskers oriented in the desired orientation direction.

6. The improvement to a process involving the deposition of a crystal structure on a substrate of claim 2 wherein the process is a polymer extrusion process, the substrate is to comprise highly-oriented fibrils disposed within polymer articles produced by the extrusion process, the substrate is formed of a non-oriented poly(tetrafluoroethylene), and said step of providing highly-oriented poly(tetrafluoroethylene) having an orientation angle of less than 20° on the surface of the substrate comprises the step of:

adding poly(tetrafluoroethylene) dispersion particles to polymer materials entering mixing and extruding apparatus performing the extrusion process producing the polymer fibers whereby mechanical friction forces between the dispersion particles and the polymer materials within and with the apparatus form highly-oriented poly(tetrafluoroethylene) fibrils within the polymer articles extruded from the apparatus and the fibrils stimulate desired oriented crystal growth throughout the articles.

7. The process of claim 1 wherein said highly-oriented poly(tetrafluoroethylene) substrate is formed by moving poly(tetrafluoroethylene) along a surface of a substrate which is not poly(tetrafluoroethylene) at a temperature and pressure which will transfer a film of the poly(tetrafluoroethylene) to the surface of said substrate which is not poly(tetrafluoroethylene).

8. The process of claim 7 wherein the poly(tetrafluoroethylene) film is used in an information storage and retrieval system and additionally comprising the step of:

selectively heating areas of the highly-oriented poly(tetrafluoroethylene) film on the surface of the substrate which is not poly(tetrafluoroethylene) in a pattern representing data information to a point where highly-oriented poly(tetrafluoroethylene) film in the heated areas is disoriented whereby subsequent deposition of the crystal-forming or liquid crystalline material on the poly(tetrafluoroethylene) film creates a recognizable difference between areas containing highly-oriented poly(tetrafluoroethylene) film and areas containing non-oriented poly(tetrafluoroethylene) film.

9. The process of claim 8 wherein the substrate which is not poly(tetrafluoroethylene) is clear and additionally comprising the steps of:
a) placing a crystal-forming or liquid crystalline material onto the poly(tetrafluoroethylene) film maintained at a temperature above the nematic-isotropic transition temperature of the liquid crystal crystalline material; and,
b) cooling the poly(tetrafluoroethylene) film to room temperature whereby the crystal-forming or liquid crystalline material forms a transparent substantially single domain in areas containing highly-oriented poly(tetrafluoroethylene) film and opaque areas in previously heated areas containing non-oriented poly(tetrafluoroethylene) film.

10. A method for forming a highly-oriented crystal structure comprising the steps of:
a) preparing a substrate having at least a portion of its surface covered with a highly-oriented poly(tetrafluoroethylene) film with an orientation angle of less than 20° as measured by wide-angle X-ray diffraction; and,
b) depositing a crystal-forming or liquid crystalline material on the highly-oriented poly(tetrafluoroethylene) film to form a highly-oriented crystal structure, with orientation corresponding to the orientation of said poly(tetrafluoroethylene) film.

11. The method of claim 10 further comprising orienting said poly(tetrafluoroethylene) film on said substrate with its nominal orientation director along a desired orientation director, and, depositing said crystal-forming or liquid crystalline material on said oriented poly(tetrafluoroethylene) film to form a highly-oriented crystal structure with orientation corresponding to the orientation of said poly(tetrafluoroethylene) film.

12. The method of claim 11 wherein the substrate is non-oriented poly(tetrafluoroethylene) and said step of preparing a substrate comprises the step of:

stressing the non-oriented poly(tetrafluoroethylene) at a surface thereof in the desired orientation direction at a temperature and pressure which will orient the non-oriented poly(tetrafluoroethylene) in the desired orientation direction.

13. The method of claim 11 wherein said substrate is not poly(tetrafluoroethylene) and said step of preparing a substrate comprises the step of:

moving a surface of the substrate along non-oriented poly(tetrafluoroethylene) in the desired orientation direction at a temperature and pressure which will transfer a film of the poly(tetrafluoroethylene) onto the surface of the substrate oriented in the desired orientation direction.

14. The method of claim 11 wherein the substrate is formed of a non-oriented poly(tetrafluoroethylene) and said step of preparing a substrate comprises the step of:

forming the non-oriented poly(tetrafluoroethylene) as whiskers oriented in the desired orientation direction.

15. The method of claim 11 wherein the process is a polymer extrusion process, the substrate is to comprise highly-oriented fibrils disposed within polymer articles produced by the extrusion process, the substrate is formed of a non-oriented poly(tetrafluoroethylene), and said step of preparing a substrate comprises the step of:

adding poly(tetrafluoroethylene) dispersion particles to polymer materials entering mixing and extruding apparatus performing the extrusion process producing the polymer articles whereby mechanical friction forces between the dispersion particles and the polymer materials within and with the apparatus form highly-oriented poly(tetrafluoroethylene) fibrils within the polymer articles extruded from the apparatus and the fibrils stimulate desired oriented crystal growth throughout the articles.

16. The method of claim 11 wherein said substrate is not poly(tetrafluoroethylene) and said step of preparing a substrate comprises the step of:

moving non-oriented poly(tetrafluoroethylene) along a surface of said substrate in the desired orientation direction at a temperature and pressure which will transfer a film of the poly(tetrafluoroethylene) onto the surface of the substrate which is oriented in the desired orientation direction.

17. The method of claim 16 wherein the substrate is used in an information storage and retrieval system and additionally comprising the step of:

selectively heating areas of the highly-oriented poly(tetrafluoroethylene) film on the surface of said substrate in a pattern representing data information to a point where highly-oriented poly(tetrafluoroethylene) film in the areas heated is disoriented whereby said subsequent step of depositing a crystal-forming or liquid crystalline material creates a recognizable difference between unheated areas containing highly-oriented poly(tetrafluoroethylene) film and heated areas containing non-oriented poly(tetrafluoroethylene) film.

18. The method of claim 17 wherein said substrate is clear and said step of depositing a crystal-forming or liquid crystalline material comprises the steps of:
   a) placing a crystal-forming or liquid crystalline material onto said poly(tetrafluoroethylene) film maintained at a temperature above the nematic-isotropic transition temperature of the crystal-forming or liquid crystalline material; and,
   b) cooling said poly(tetrafluoroethylene) film to room temperature whereby the crystal forming or liquid crystalline material forms a transparent substantially single domain in unheated areas containing highly-oriented poly(tetrafluoroethylene) and opaque areas in heated areas containing non-oriented poly(tetrafluoroethylene).

19. A method according to claim 1 wherein said highly-oriented poly(tetrafluoroethylene) substrate is made during the polymerization of tetrafluoroethylene.

20. A method according to claim 1 wherein said highly oriented poly(tetrafluoroethylene) substrate is made by deforming poly(tetrafluoroethylene).

21. A method according to claim 1 wherein said crystal-forming or liquid crystalline material is in a form selected from the group comprising gas, liquid, melt and solution for contacting said highly oriented poly(tetrafluoroethylene) substrate.

22. A method according to claim 1 in which said solidification of said crystal-forming or liquid crystalline material is effected by a method selected from the group consisting of freezing, precipitating, polymerizing, and curing.

23. A method for growing a highly-oriented crystal on filament substrate comprising the steps of:
   a) rubbing the filament longitudinally along non-oriented poly(tetrafluoroethylene) to form a film of highly-oriented poly(tetrafluoroethylene) thereon with an orientation angle of less than 20° as measured by wide-angle X-ray diffraction and oriented longitudinally on an outer surface of the filament; and,
   b) depositing a crystal-forming or liquid crystalline material on the highly-oriented poly(tetrafluoroethylene) film to form a highly oriented crystal structure with orientation corresponding to the orientation of said poly(tetrafluoroethylene) film.

* * * * *